United States Patent
Tabaru

(10) Patent No.: US 7,462,565 B2
(45) Date of Patent: *Dec. 9, 2008

(54) METHOD OF MANUFACTURING SEMICONDUCTOR DEVICE

(75) Inventor: Kenji Tabaru, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/489,471

(22) Filed: Jul. 20, 2006

(65) Prior Publication Data

US 2006/0258160 A1    Nov. 16, 2006

Related U.S. Application Data

(63) Continuation of application No. 10/464,790, filed on Jun. 19, 2003, now Pat. No. 7,098,139.

(30) Foreign Application Priority Data

Feb. 17, 2003    (JP) .............................. 2003-038320

(51) Int. Cl.
*H01L 21/302* (2006.01)
(52) U.S. Cl. .................. 438/710; 438/438; 438/706; 438/710; 438/680; 438/687; 438/768; 438/777; 438/778; 257/762; 118/723
(58) Field of Classification Search ................. 438/710; 257/762; 118/723
See application file for complete search history.

(56) References Cited

U.S. PATENT DOCUMENTS

| | | | |
|---|---|---|---|
| 4,209,356 A | 6/1980 | Stein | |
| 4,588,641 A | 5/1986 | Haque et al. | |
| 5,244,535 A * | 9/1993 | Ohtsuka et al. | |
| 5,892,286 A | 4/1999 | Toyoda et al. | |
| 6,057,247 A | 5/2000 | Imai et al. | |
| 6,143,658 A | 11/2000 | Donnelly, Jr. et al. | |
| 6,162,733 A | 12/2000 | Obeng | |
| 6,174,796 B1 * | 1/2001 | Takagi et al. ................. 438/622 |
| 6,204,192 B1 | 3/2001 | Zhao et al. | |
| 6,323,121 B1 * | 11/2001 | Liu et al. | |
| 6,355,571 B1 | 3/2002 | Huang et al. | |

(Continued)

FOREIGN PATENT DOCUMENTS

JP    4-286327 A  *  10/1992

(Continued)

OTHER PUBLICATIONS

S. Wolf, Silicon Processing for the VLSI Era, vol. 1, Lattice Press, (1986) pp. 568-569.*

*Primary Examiner*—Shamim Ahmed
*Assistant Examiner*—Maki Angadi
(74) *Attorney, Agent, or Firm*—Leydig, Voit & Mayer, Ltd.

(57) ABSTRACT

A substrate having a copper wiring is prepared. An insulating film is formed on the copper wiring. The insulating film is etched with a gas containing fluorine to form an opening reaching the copper wiring. A plasma treatment is carried out on a surface of copper exposed at a bottom of the opening without turning plasma discharge off after forming the opening in the same chamber as the formation of the opening.

21 Claims, 4 Drawing Sheets

U.S. PATENT DOCUMENTS

| | | | |
|---|---|---|---|
| 6,562,416 B2 | 5/2003 | Ngo et al. | |
| 6,635,185 B2 | 10/2003 | Demmin et al. | |
| 6,784,109 B2 * | 8/2004 | Kofuji et al. | |
| 2001/0008226 A1 | 7/2001 | Hung et al. | |
| 2002/0113037 A1 | 8/2002 | Wu et al. | |
| 2002/0142622 A1 * | 10/2002 | Iijima et al. | 438/768 |
| 2002/0185671 A1 | 12/2002 | Kim | |
| 2003/0181041 A1 * | 9/2003 | Ikegami et al. | 438/687 |
| 2004/0018715 A1 | 1/2004 | Sun et al. | |
| 2004/0046260 A1 | 3/2004 | Huang et al. | |

FOREIGN PATENT DOCUMENTS

| | | |
|---|---|---|
| JP | 10-261715 | 9/1998 |
| JP | 11-145111 | 5/1999 |
| JP | 2000-332112 | 11/2000 |
| JP | 2001-23985 A * | 1/2001 |
| JP | 2001-118846 | 4/2001 |
| JP | 2003-23072 A * | 1/2003 |
| JP | 2003-109955 A * | 4/2003 |
| KR | 2002-0056013 | 7/2002 |
| KR | 2002-0094598 | 12/2002 |
| WO | WO 00/19498 | 4/2000 |

* cited by examiner

METHOD OF MANUFACTURING SEMICONDUCTOR DEVICE

BACKGROUND OF THE INVENTION

1. Field of the Invention

This invention relates to a method of manufacturing a semiconductor device, and more particularly, to a method of manufacturing a semiconductor device having copper wiring.

2. Background Art

Copper (Cu) has been employed as a wiring material in semiconductor devices. Copper is advantageous in that it is lower in resistance than aluminum (Al), with its permissible current in reliability being greater by two or more orders of magnitude than Al. Accordingly, the comparison between copper and aluminum leads to the fact that when using copper in order to obtain the same level of wiring resistance, the film thickness can be made smaller, with the possibility that the capacitance between wiring is reduced.

On the other hand, copper has the problem that it exhibits a high diffusion velocity in a silicon (Si) film or a silicon oxide ($SiO_2$) film. In order to solve this problem, it has been usual to provide a multi-layered wiring structure (see, e.g., Japanese Patent Laid-open No. 10-261715).

Reference is now made to a copper wiring procedure in a multi-layered wiring structure. Initially, a first trench is formed in a first silicon oxide film. After the formation of a barrier metal film for preventing copper from being diffused toward the inner walls of the first trench, copper is buried in the first trench to form a first wiring layer. Next, after the formation of a silicon nitride ($Si_3N_4$) film on the first silicon oxide film so as to cover the first wiring layer therewith, a second silicon oxide film is formed on the silicon nitride film. Subsequently, the second silicon oxide film and the silicon nitride film are, respectively, etched to form a via hole and a second trench. Thereafter, the via hole and the second trench are, respectively, formed with a barrier metal on the inner surfaces thereof, and copper is buried in the via hole and the second trench, thereby forming a via plug and a second wiring layer. According to the steps set out hereinabove, the first wiring layer and the second wiring layer are electrically connected with each other through the via plug to form copper wiring having a multi-layered wiring structure.

In the above copper wiring procedure, when the via hole and the second trench are formed, the second silicon oxide film is etched to reach the surface of the silicon nitride film. Then, the silicon nitride film is etched with a mixed gas of tetrafluoromethane ($CF_4$) and oxygen ($O_2$), or a mixed gas of trifluoromethane ($CHF_3$) and oxygen as an etching gas. In this way, copper for forming the first wiring layer is exposed to at the bottom of the via hole.

However, a fluorine-based deposit derived from the etching gas for the silicon nitride film is left on the copper surface immediately after the etching, with the attendant problem that the reaction between the fluorine and the copper enables a fluorine-containing polymer film to be formed on the copper surface. The formation of such a polymer film creates such a state that a native oxide film on the copper surface is undesirably broken. In this condition, if the semiconductor substrate is removed to outside of the etching chamber, the copper reacts with moisture in air thereby causing the copper to be corroded.

SUMMARY OF THE INVENTION

In view of the problems set above, the invention has been accomplished. It is therefore an object of the invention to provide a method for manufacturing a semiconductor device wherein a contaminant containing a fluorine-containing polymer is removed from an exposed copper surface to provide such a state that a native oxide film is formed on the copper surface, thereby suppressing the copper from being corroded.

According to one aspect of the present invention, in a method of manufacturing a semiconductor device, a substrate having a copper wiring is prepared. An insulating film is formed on the copper wiring. The insulating film is etched with a gas containing fluorine to form an opening reaching the copper wiring. A plasma treatment is carried out on a surface of copper exposed at a bottom of the opening without turning plasma discharge off after forming the opening in the same chamber as the formation of the opening.

According to another aspect of the present invention, in a method of manufacturing a semiconductor device, a substrate having a copper wiring is prepared. An insulating film is formed on the copper wiring. The insulating film is etched with a gas containing fluorine to form an opening reaching the copper wiring. A plasma treatment is carried out on a surface of copper exposed at a bottom of the opening. The formation of the opening and the plasma treatment are carried out in the same chamber. After forming the opening, the plasma discharge is once stopped and the chamber is evacuated, and thereafter, the plasma treatment is carried out.

According to other aspect of the present invention, in a method of manufacturing a semiconductor device having a multi-layered wiring structure, a first interlayer insulating film is formed on a semiconductor substrate. A trench is formed in the first interlayer insulating film. A first barrier metal layer is formed inside the trench. A first copper layer is buried through the first barrier metal layer in the groove to form a first wiring layer. A silicon nitride film is formed on the first interlayer insulating film and the first wiring layer. A second interlayer insulating film is formed on the silicon nitride film. The second interlayer insulating film is etched to expose part of the silicon nitride film. The exposed silicon nitride film is etched with a gas containing fluorine to form a via hole exposing the first copper layer. A plasma treatment is carried out on the exposed first copper layer to remove a contaminant containing a polymer containing fluorine. A second barrier metal film is formed inside the via hole. A second copper layer is buried through the second barrier metal film in the via hole to form a via plug.

Other and further objects, features and advantages of the invention will appear more fully from the following description.

DETAILED DESCRIPTION OF THE PREFERRED EMBODIMENTS

The embodiments of the invention are described in detail with reference to the accompanying drawings.

First Embodiment

A method of manufacturing a semiconductor device according to an embodiment of the invention is characterized by comprising the steps of forming an insulating film on copper wiring, etching the insulating film by use of a fluorine-containing gas to form an opening reaching the copper wiring, and subjecting, after the step of forming the opening, the surface of copper exposed at a bottom of the opening to plasma treatment continuously in the same chamber without stopping plasma discharge.

Figure 1:
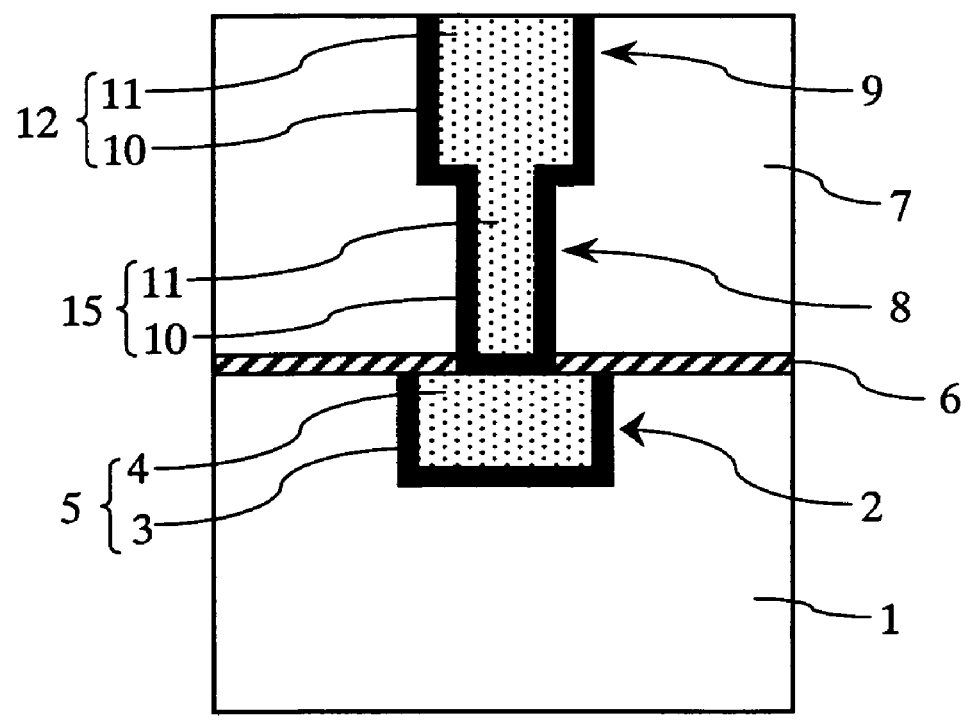
FIG. 1 is a partial sectional view of a semiconductor device according to the present invention.

FIG. 1 is a partial sectional view illustrating a wiring structure of a semiconductor device according to this embodiment.

As shown in FIG. 1, the semiconductor device of the embodiment has a multi-layered wiring structure.

More specifically, a first interlayer insulating layer 1, such as a silicon oxide ($SiO_2$) film or the like, formed on a semiconductor substrate (not shown) is formed with a first trench 2 for burying of wiring therein. A first barrier metal film 3 for preventing copper (Cu) from being diffused is formed on the inner surfaces (i.e. inner walls and a bottom surface herein and whenever they appear hereinafter) of the first trench 2. The first barrier metal film 3 used may be made, for example, of a titanium (TiN) film, a tantalum nitride (TaN) film or the like. A first copper layer 4 is buried in the first trench 2 in which the first barrier metal film 3 has been formed, thereby forming a first wiring layer 5.

A second interlayer insulating film 7 is formed on the first interlayer insulating film 1 and the first wiring layer 5 via a silicon nitride ($Si_3N_4$) film 6 serving as an insulating film. For example, a silicon oxide film may be used for the second interlayer insulating film 7. A via hole 8 and a second trench 9 are formed in the second interlayer insulating film 7 over the first wiring layer 5, and a second barrier metal film 10 is formed on the inner surfaces thereof in order to prevent diffusion of copper. For example, a titanium nitride film or tantalum nitride film may be used for the second barrier metal film 10. A second copper layer 11 is buried in the via hole 8 and the second trench 9, in which the second barrier metal film 10 has been formed, thereby forming a via plug 15 and a second wiring layer 12.

With such a structure, the first wiring layer 5 and the second wiring layer 12 are electrically connected with each other through the via plug 15.

Next, a description is now made of the method for manufacturing the semiconductor device according to the invention with reference to FIGS. 2A to 2E and FIG. 3. It will be noted that in FIGS. 2A to 2E and FIG. 3, like reference numerals indicate like portions or members as in FIG. 1.

Figure 2A:
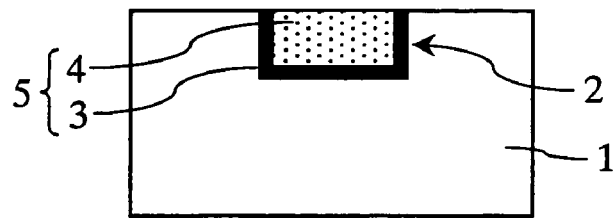
FIGS. 2A-2E show a method of manufacturing a semiconductor device according to the present invention.

Initially, the first trench 2 is formed by etching the first interlayer insulating film 1 formed on a semiconductor substrate (not shown), and the first barrier metal film 3 is formed on the inner surfaces of the first trench 2. Thereafter, the first copper layer 4 is buried in the first trench 2 to form the first wiring layer 5 (FIG. 2A).

More specifically, the procedure of forming the first wiring layer includes the steps of forming the first interlayer insulating film, etching the first interlayer insulating film to form the first trench, forming the first barrier metal film on the inner surfaces of the first trench, and forming the first copper layer inside the first trench through the first barrier metal.

The first trench can be formed by anisotropic plasma etching with an etching gas such as, a mixed gas of hexafluorobutadiene ($C_4F_6$), oxygen ($O_2$) and argon (Ar), or a mixed gas of as octafluorobutene ($C_4F_8$) and argon.

The formation of the first barrier metal film and the burying of the first copper layer can be performed in the following way. Initially, a barrier metal film such as a titanium nitride film or tantalum nitride film is formed by a chemical vapor deposition method (hereinafter referred to as CVD method) or a sputtering method, followed by formation of a copper layer. Subsequently, the copper layer and the barrier metal film are polished according to a chemical mechanical polishing (hereinafter referred to as CMP) method. In this way, the copper layer and the barrier metal film are left only inside the first trench.

The formation of the first barrier metal film and the burying of the first copper layer may be performed by other methods, respectively. For instance, after the formation of the barrier metal film only inside the first trench by CVD and CMP methods, the copper layer may be buried in the inside of the first trench by a plating method using an electrolytic solution based on copper sulfate ($CuSO_4$).

Figure 2B:
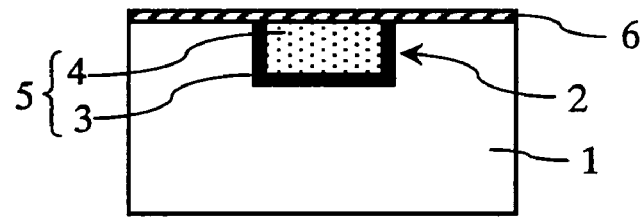

Next, as shown in FIG. 2B, a silicon nitride film 6 is formed over the first interlayer insulating film 1 and the first wiring layer 5. The silicon nitride film 6 may be formed, for example, by a CVD or sputtering method.

Figure 2C:
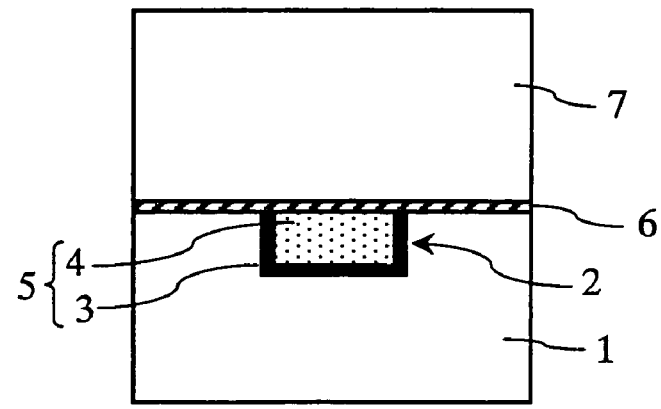

Subsequently, as shown in FIG. 2C, the second interlayer insulating film 7 is formed on the silicon nitride film 6. For instance, a silicon oxide film may be formed by a CVD or sputtering method for use as the second interlayer insulating film.

Next, the via hole and the second trench e for second wiring layer are, respectively, formed.

First, using a photolithographic technique, the second interlayer insulating film is anisotropically etched. More specifically, using a resist pattern (not shown) formed on the second interlayer insulating film 7 as a mask, the second interlayer insulating film 7 is etched to an extent of reaching the silicon nitride film 6. In other words, this etching enables part of the surface of the silicon nitride film 6 to be exposed. For an etching gas, there can be used, for example, a mixed gas of hexafluorobutadiene ($C_4F_6$), oxygen ($O_2$) and argon (Ar), or a mixed gas of octafluorobutene ($C_4F_8$) and argon. Next, the exposed silicon nitride film 6 is etched to cause the first copper layer 4 of the first wiring layer 5 to be exposed.

According to the etching treatments set out hereinabove, the via hole 8 and the second trench 9 can be made as is particularly shown in FIG. 2D.

The silicon nitride film 6 may be etched by anisotropic plasma etching using a fluorine-containing gas. Examples of the fluorine-containing gas include gases containing tetrafluoromethane or trifluoromethane. Specific examples include a mixed gas of tetralfuoromethane and oxygen, a mixed gas of tetralfuoromethane, oxygen and argon, a mixed gas of trifluoromethane and oxygen, and a mixed gas of trifluoromethane, oxygen and argon.

In the method of manufacturing a semiconductor device according to the invention, after completing of the etching step of the silicon nitride film, the cleaning step of removing a contaminant formed on the exposed surface of the first copper layer is carried out. The term "contaminant" used herein means a fluorine-containing polymer film formed by reaction between fluorine and copper, or a fluorine-containing polymer film deposited on the copper.

In the practice of the invention, it is preferred that the semiconductor substrate, particularly, the exposed surface of the first copper layer is not in contact with air. More specifically, the etching and cleaning steps of the silicon nitride should preferably be carried out in the same chamber.

Examples of the etching systems usable in the etching and cleaning steps of the silicon nitride film include a parallel plate etching system, an electron cyclone etching system, and an inductive coupling etching system.

The cleaning step can be particularly carried out by subjecting the surface of the first copper layer to plasma treatment.

After completing the etching step of the silicon nitride film, a gas for plasma treatment is introduced into the chamber. For example, argon, oxygen, hydrogen ($H_2$), nitrogen ($N_2$), a mixed gas of hydrogen and nitrogen, a mixed gas of oxygen and argon, a mixed gas of nitrogen and argon, or a mixed gas of hydrogen and argon may be introduced into the chamber.

Figure 3:
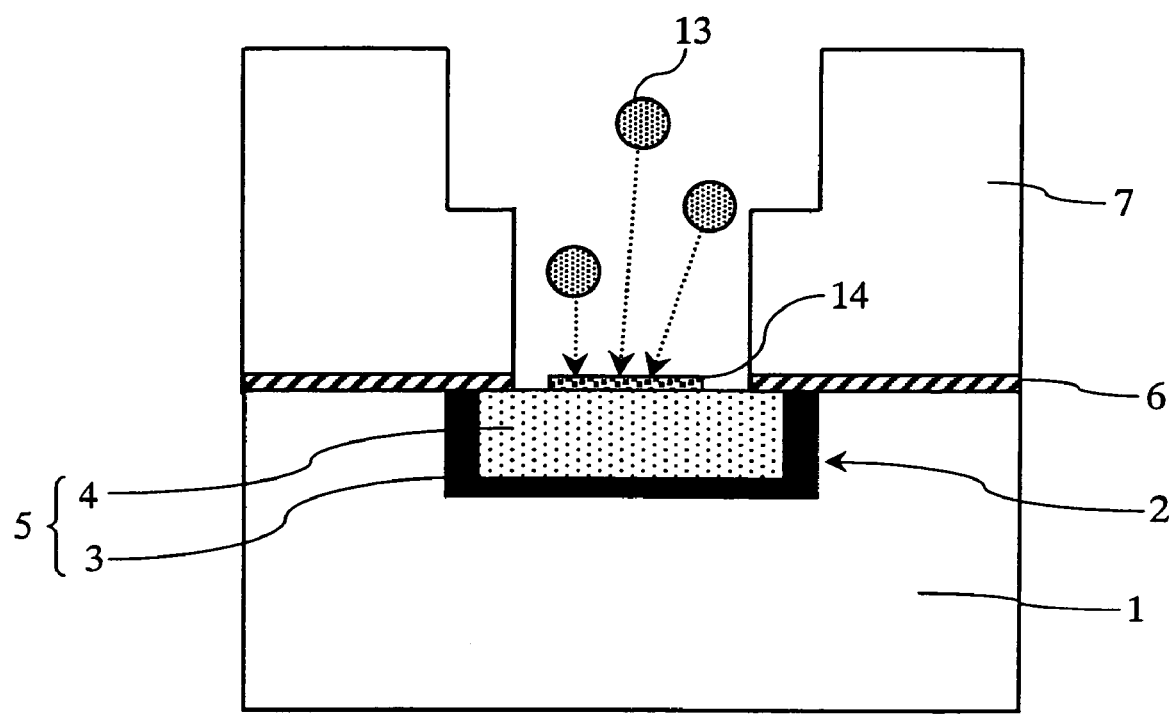
FIG. 3 shows a method of manufacturing a semiconductor device according to the present invention.

In this embodiment, the above-mentioned gas is converted into a plasma subsequent to the conversion, into a plasma, of the etching gas used in the etching step of the silicon nitride film. More specifically, the plasma discharge that has been continuedly carried out in the etching step is not stopped, followed by the cleaning step. It will be noted that the conversion into plasma may be carried out by any of arbitrary methods, which include a method using irradiation with a microwave, and a method based on inductive coupling or capacitive coupling by use of high frequency Next, RF bias power is applied between facing electrodes placed in the etching system. More specifically, bias power is applied between an electrode supporting the semiconductor substrate and a counter electrode that is in face-to-face relation with the first-mentioned electrode through the semiconductor substrate. This permits argon ions, oxygen ions, hydrogen ions or nitrogen ions generated in the resultant plasma to be attracted toward one of the electrodes by the coulomb force. Accordingly, when the semiconductor substrate is placed at an appropriate position between the electrodes, the ions 13 are allowed to collide with the surface (i.e. copper and fluorine atoms) of the first copper layer 4 as shown in FIG. 3. The ions 13 generated in the plasma has high energy, so that the collision and reaction with the copper atoms and fluorine atoms existing in the surface of the first copper layer 4 enables a polymer film 14 to be removed.

An instance of the cleaning step is described below.

An etching system, which has a pair of facing electrodes composed of an upper electrode and a lower electrode and the lower electrode serves as a holder for semiconductor substrate, is used. The etching system may be of any type including a parallel plate type, an electron cyclone type or an inductive coupling type. The semiconductor substrate is placed on the lower electrode in such a way that the exposed surface of the first copper layer is turned toward the side of the upper electrode. Next, a mixed gas of argon and oxygen is introduced into the chamber, with its pressure being kept, for example, at 50 mTorr. The flow rate of the introduced gas is, for example, at 400 sccm for the argon gas and 20 sccm for oxygen gas. Power of 1,400 W is applied to the upper electrode, and power of 1,000 W is applied to the lower electrode, under which argon and oxygen ions generated in the plasma are allowed to collide with the surface of the first copper layer.

It is preferred that throughout the etching and cleaning steps of the silicon nitride film, the surface temperature of the electrode serving as a holder supporting the semiconductor substrate is set at 25° C. or below. This can suppress the positive oxidation reaction of copper from occurring as would otherwise take place in the case where the oxygen gas is introduced into the chamber. In the above instance, the surface temperature of the lower electrode can be set, for example, at 20° C.

When the high-energy ions, such as the argon and oxygen ions, are brought into collision with the exposed surface of the first copper layer subsequent to the etching step of the silicon nitride film, a fluorine-containing polymer film can be removed from the surface of the first copper layer. In addition, the fluorine atoms attached to the surface of the first copper layer can also be removed, so that the formation of a fresh polymer film can be prevented. Thus, a native oxide film can be formed uniformly over the surface of the first copper layer, under which if the semiconductor substrate is removed to the outside of the chamber, the copper is not corroded by the action of moisture in air.

Since a native oxide film plays a role in preventing the corrosion of copper, it is sufficient that the film is formed thinly on the uppermost surface of the exposed first copper layer. On the other hand, in the case where an oxygen gas is introduced into the chamber in the cleaning step, copper is oxidized by means of the oxygen gas. The oxidation in this case is positive oxidation of copper, unlike the oxidation involved in the formation of the native oxide film. Accordingly, it is preferable to suppress the reaction so that the oxidation of copper does not proceed so far. According to this embodiment, the oxidation reaction of copper can be suppressed by keeping the surface temperature of the electrode supporting the semiconductor substrate at 25° C. or below. In this connection, the lower limit of the surface temperature of the electrode is not critical so far as it does not adversely affect the plasma treatment.

After completion of the cleaning step, the via hole 8 and the second trench 9 are formed therein with the second barrier metal 10 and buried with the second copper layer 11. Specifically, the following procedure is carried out.

Initially, a barrier metal film, such as a titanium film or tantalum nitride film, is formed by a CVD or sputtering method, followed by further formation of a copper layer thereover. Subsequently, the copper layer and the barrier metal film are polished by a CMP method. Thus, the copper layer and the barrier metal film can be left only inside the via hole and the second trench.

The formation of the second barrier metal film and the burying of the second copper layer may be performed by other methods. For instance, a barrier metal is left only in the inside of the second trench by CVD and CMP methods, after which copper may be buried inside the second groove by a plating method using a copper sulfate-based ($CuSO_4$) electrolytic solution.

Figure 2D:
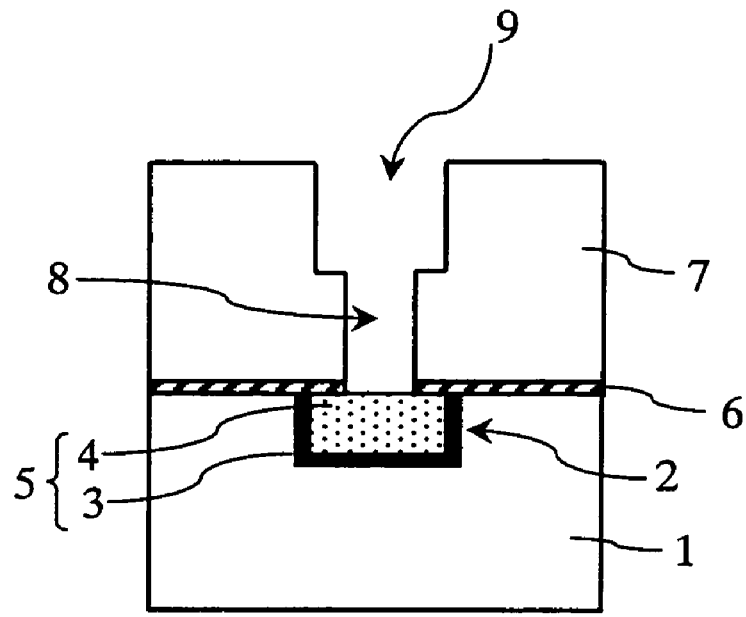
Figure 2E:
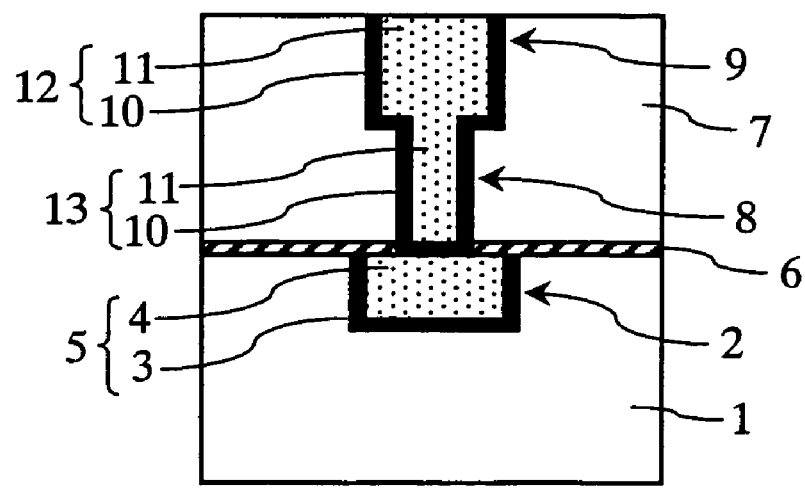

According to the steps set out hereinabove, the first wiring layer 5, via plug 15 and second wiring layer 12 can be formed (FIG. 2E). The second wiring layer 12 is electrically connected with the first wiring layer 12 through the via plug 15.

In this embodiment, although the silicon nitride film is formed between the first interlayer insulating film and the second interlayer insulating film, the invention is not limited to this formation. Other types of film may be used for the insulating film insofar as it can be etched by means of a fluorine-containing etching gas.

Although the instance of forming the first wiring layer and the second wiring layer has been described in this embodiment, the invention is not limited to this instance. When like steps are repeated the desired number of times, a third wiring layer, a fourth wiring layer and the like layers may be formed over the second wiring layer.

According to the embodiment, when argon ions, oxygen ions and the like are allowed to collide against and react with the copper layer surface subsequent to the etching step of the silicon nitride film, a fluorine-containing polymer film and the like may be removed from the copper layer surface. This enables formation of a native oxide film on the exposed surface of the copper layer, so that the corrosion of the copper through reaction between moisture in air and the copper can be prevented.

According to the embodiment, when the surface temperature of an electrode supporting the semiconductor substrate is kept at 25° C. or below, progress in oxidation of copper with an oxygen gas in the chamber can be suppressed.

Second Embodiment

The method for manufacturing a semiconductor device according to this embodiment is characterized by comprising the steps of forming an insulating film on a copper wiring, subjecting the insulating film to plasma etching by use of a fluorine-containing gas to form an opening reaching the copper wiring, once stopping plasma discharge and evacuating the chamber after the formation of the opening, and subjecting an exposed surface of copper at the bottom of the opening to plasma treatment in the same chamber.

The wiring structure of the semiconductor device according to this embodiment is similar to the structure illustrated in the first embodiment with reference to FIG. 1.

Next, with reference to FIGS. 2A to 2E, the method for manufacturing the semiconductor device of this embodiment is described.

A first wiring layer as shown in FIG. 2A is formed. This layer can be formed in the same manner as in the first embodiment.

Next, as shown in FIG. 2B, a silicon nitride film 6 is formed over a first interlayer insulating film 1 and a first wiring layer 5. The silicon nitride film 6 can be formed, for example, by a CVD or sputtering method.

Subsequently, as shown in FIG. 2C, a second interlayer insulating film 7 is formed on the silicon nitride film 6. For instance, a silicon oxide film is formed by a CVD or sputtering method to provide the second interlayer insulating film.

Next, a via hole 8 and a second trench 9 for second wiring layer are formed.

For this purpose, a photolithographic method is used for anisotropically etching the second interlayer insulating film 7. More specifically, a resist pattern (not shown) formed on the second interlayer insulating film 7 is provided as a mask, through which the second interlayer insulating film 7 is etched to an extent of reaching the surface of the silicon nitride film 6. For the etching gas, a mixed gas of hexafluorobutadiene ($C_4F_6$), oxygen ($O_2$) and argon (Ar), a mixed gas of octafluorobutene ($C_4F_8$) and argon or the like. Next, the exposed silicon nitride film 6 is further etched thereby causing the first copper layer 4 of the first wiring layer 5 to be exposed.

According to the above-mentioned etching treatments, a via hole 8 and a second trench 9 can be formed as shown in FIG. 2D.

The silicon nitride film 6 can be etched by anisotropic plasma etching using a fluorine-containing gas. Examples of the fluorine-containing gas include gases containing tetrafluoromethane or trifluoromethane. More specifically, there can be used a mixed gas of tetrafluoromethane and oxygen, a mixed gas of tetrafluoromethane, oxygen and argon, a mixed gas of trifluoromethane and oxygen, or a mixed gas of trifluoromethane, oxygen and argon.

This embodiment is characterized in that after the step of etching the silicon nitride film, the chamber is evacuated in such a state that plasma discharge is turned off whereby a fluorine-containing gas or the fluorine component derived from a fluorine-containing gas is substantially removed from the chamber.

More specifically, according to this embodiment, the cleaning step illustrated with respect to the first embodiment is carried out after removing an etching gas component, such as fluorine molecules, attached to the inside of the chamber and the semiconductor substrate as much as possible. This permits the fluorine molecules and the like attached to the inside of the chamber to be prevented from attaching to the semiconductor substrate. In addition, the fluorine molecules attached to the surface of the semiconductor substrate can be removed to an extent. Accordingly, a contaminant can be substantially completely removed from the surface of the first copper layer in the next cleaning step.

After the substantial removal of the etching component through the evacuation of the chamber, the cleaning step illustrated in the first embodiment is carried out. It will be noted that in the second embodiment, the etching step of the silicon nitride film, the removing step of an etching gas by evacuation and the cleaning step are performed in the same chamber.

Examples of the etching systems usable in the second embodiment include a parallel plate etching system, an electron cyclone etching system, and an inductive coupling etching system.

The cleaning step can be carried out in the same manner as in the first embodiment.

Initially, a gas for plasma treatment is introduced into the chamber. For instance, argon, oxygen, hydrogen ($H_2$), nitrogen ($N_2$), a mixed gas of hydrogen and nitrogen, a mixed gas of oxygen and argon, a mixed gas of nitrogen and argon, or a mixed gas of hydrogen and argon, or the like may be introduced into the chamber.

Next, plasma discharge is turned on thereby converting the gas into a plasma. The plasma conversion may be effected by any of arbitrary methods including a method using irradiation with a microwave, and an inductive or capacitive coupling method using high frequency.

Next, RF bias power is applied between facing electrodes placed in the etching system. More specifically, bias power is applied between an electrode supporting the semiconductor substrate and a counter electrode that is in face-to-face relation with the first-mentioned electrode through the semiconductor substrate. This permits argon ions, oxygen ions, hydrogen ions or nitrogen ions generated in the resultant plasma to be attracted toward one of the electrodes by the coulomb force. Accordingly, when the semiconductor substrate is placed at an appropriate position between the electrodes, the ions 13 are allowed to collide with the surface (i.e. copper and fluorine atoms) of the first copper layer 4 as shown in FIG. 3. The ions 13 generated in the plasma has high energy, so that the collision and reaction with the copper atoms and fluorine atoms existing in the surface of the first copper layer 4 enables a polymer film 14 to be removed.

In this way, the contaminant containing a fluorine-containing polymer can be efficiently removed from the surface of the copper layer by allowing high-energy ions, such as argon ion or oxygen ions, to collide against the surface of the copper layer after the evacuation of the chamber subsequent to the etching step of the silicon nitride film. Accordingly, it is becomes possible to uniformly form a native oxide film on the exposed surface of the copper layer, under which if the semiconductor substrate is removed to outside of the chamber, copper is not corroded with moisture in air.

Since a native oxide film plays a role in preventing the corrosion of copper, it is sufficient that the film is formed thinly on the uppermost surface of the exposed copper layer. On the other hand, in case where oxygen gas is introduced into the chamber in the cleaning step, copper is oxidized by means of the oxygen gas. The oxidation in this case is positive oxidation of copper, unlike the oxidation involved in the formation of the native oxide film. Accordingly, it is preferable to suppress the reaction so that the oxidation of copper does not proceed so far. As stated in the first embodiment, the oxidation reaction of copper can be suppressed by keeping the surface temperature of the electrode supporting the semiconductor substrate at 25° C. or below. It will be noted that the lower limit of the surface temperature of the electrode is not critical so far as it does not adversely affect the plasma treatment.

After completion of the cleaning step, the via hole 8 and the second trench 9 are, respectively, formed therein with a second barrier metal 10 and buried with a second copper layer 11. Specifically, the following procedure is carried out. Initially, a barrier metal film, such as a titanium film or tantalum nitride film, is formed by a CVD or sputtering method, followed by further formation of a copper layer thereover. Subsequently, the copper layer and the barrier metal film are polished by a CMP method. Thus, the copper layer and the barrier metal film can be left only inside the via hole and the second groove.

The formation of the second barrier metal film and the burying of the second copper layer may be performed by other methods. For instance, a barrier metal is left only in the inside of the second trench by CVD and CMP methods, after which copper may be buried inside the second trench according to a plating method using a copper sulfate-based ($CuSO_4$) electrolytic solution.

According to the steps set out hereinabove, the first wiring layer 5, via plug 15 and second wiring layer 12 can be formed (FIG. 2E). The second wiring layer 12 is electrically connected with the first wiring layer 12 through the via plug 15.

In this embodiment, although the silicon nitride film is formed between the first interlayer insulating film and the second interlayer insulating film, the invention is not limited to this formation. Other type of film may be used insofar as it can be used as an insulating film and can be etched by means of a fluorine-containing etching gas.

Although the instance of forming the first wiring layer and the second wiring layer has been stated in this embodiment, the invention is not limited to this instance. When like steps are repeated the desired number of times, a third wiring layer, a fourth wiring layer and the like layers may be formed over the second wiring layer.

According to the embodiment, etching gas components attached to the inside of the chamber and the surface of the semiconductor substrate can be removed by evacuation of the chamber subsequent to the etching step of the silicon nitride film. In other words, the number of fluorine atoms on the surface of the first copper layer can be reduced to some extent prior to the cleaning step. Accordingly, it becomes possible to substantially completely remove a contaminant, such as a fluorine-containing polymer film, from the surface of the copper layer by collision and reaction of argon ions or oxygen ions with the surface of the copper layer in the cleaning step.

In the first embodiment and the second embodiment, although the instances of subjecting, to plasma treatment, the first wiring layer and the first copper layer that are exposed for the formation of the second wiring layer have been described, the invention is not limited to these instances. The method of the invention is applicable to any purpose insofar as it is to remove a contaminant from the surface of copper which is contaminated through etching using a fluorine-containing gas.

For instance, the invention is applicable to methods of manufacturing semiconductor devices having copper wiring. In this sense, the invention may be directed to a method for manufacturing a semiconductor device, which is characterized by comprising the steps of forming an insulating film on copper wiring, etching the insulating film by use of a fluorine-containing gas to form an opening reaching the copper wiring, and subjecting, to plasma treatment, a surface of copper exposed at the bottom of the opening. The step of forming the opening and the plasma-treating step can be carried out in the same chamber. After the step of forming the opening, the chamber may be evacuated to substantially remove a fluorine-containing gas and a fluorine component derived from the fluorine-containing gas from the chamber, followed by the plasma treatment. The insulating film may be made of either a silicon nitride film, or a film wherein a silicon oxide film is built up on a silicon nitride film.

The features and advantages of the present invention may be summarized as follows.

According to one aspect, a contaminant such as a fluorine-containing polymer film is removed from an exposed surface of a copper layer, so that the surface of the copper layer can be brought to a state where a native oxide film is formed. This enables the copper to be prevented from corroding with moisture in air.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2003-038320, filed Feb. 17, 2003 including specification, claims, drawings and summary, on which the Convention priority of the present application is based, are incorporated herein by reference in its entirety.

What is claimed is:

1. A method of manufacturing a semiconductor device comprising:
   preparing a first interlayer insulator film including copper wiring and supported by a semiconductor substrate;
   forming an insulating film on said copper wiring;
   forming a second interlayer insulator film on said insulating film;
   forming a via hole in said second interlayer insulator film, said via hole including a first opening reaching said insulating film;
   etching said insulating film at the bottom of said first opening in a first plasma discharge within a gas mixture including fluorine and thereby forming a second opening reaching said copper wiring;
   after said first plasma discharge is once extinguished, and before exposing said second opening to the atmosphere, treating said copper wiring at the bottom of said second opening with a second plasma discharge, thereby removing contamination, including a polymer containing fluorine, from said copper wiring; and
   during treating said copper wiring with said second plasma discharge, applying a bias power between a first electrode supporting said semiconductor substrate and a second electrode, opposite said first electrode, with said semiconductor substrate between said first and second electrodes, and maintaining surface temperature of said first electrode at no more than 25° C.

2. The method of manufacturing a semiconductor device according to claim 1, wherein said insulating film is a silicon nitride film.

3. The method of manufacturing a semiconductor device according to claim 1, wherein said gas mixture includes at least one of tetrafluoromethane and trifluoromethane.

4. The method of manufacturing a semiconductor device according to claim 1, including establishing said second plasma discharge in an ambient selected from the group consisting of argon, oxygen, hydrogen, nitrogen, a mixture of hydrogen and nitrogen, a mixture of oxygen and argon, a mixture of nitrogen and argon, and a mixture of hydrogen and argon.

5. A method of manufacturing a semiconductor device comprising:

forming a first dielectric layer supported by a semiconductor substrate;
forming a groove in said first dielectric layer;
depositing a first barrier metal layer in the groove;
depositing a first copper layer on said first barrier metal layer in the groove to form wiring;
depositing an insulating film on said first dielectric layer and said wiring;
forming a second dielectric layer on said insulating film;
etching said second dielectric layer to form a via hole reaching said insulating film;
etching said insulating film in said via hole with a gas mixture including fluorine to expose a part of said wiring;
before exposing the part of said wiring that is exposed by etching and said via hole to the atmosphere, plasma treating said wiring in said via hole to remove contamination, including fluorine, from said wiring;
depositing a second baffler metal in said via hole;
depositing a second copper layer on said second barrier metal; and
during plasma treating said wiring, applying a bias power between a first electrode supporting said semiconductor substrate and a second electrode, opposite said first electrode, with said semiconductor substrate between said first and second electrodes, and maintaining surface temperature of said first electrode at no more than 25° C.

6. A method of manufacturing a semiconductor device comprising:
preparing a first interlayer insulator film including first copper wiring and supported by a semiconductor substrate;
forming an insulating film on said first copper wiring;
forming a second interlayer insulator film on said insulating film;
forming a first opening in said second interlayer insulator film, said first opening reaching said insulating film;
etching said insulating film at the bottom of said first opening in a first plasma discharge within a gas mixture including fluorine and thereby forming a second opening reaching said first copper wiring;
before exposing said second opening to the atmosphere, treating said first copper wiring at the bottom of said second opening with a second plasma discharge to remove contamination, including a polymer containing fluorine: from said first copper wiring; and
during treating said first copper wiring with said second plasma discharge, applying a bias power between a first electrode supporting said semiconductor substrate and a second electrode, opposite said first electrode, with said semiconductor substrate between said first and second electrodes, and maintaining surface temperature of said first electrode at no more than 25° C.

7. The method of manufacturing a semiconductor device according to claim 6, wherein said insulating film is a silicon nitride film.

8. The method of manufacturing a semiconductor device according to claim 6, wherein said gas mixture includes at least one of tetrafluoromethane and trifluoromethane.

9. The method of manufacturing a semiconductor device according to claim 6, comprising, after treating said first copper wiring with said second plasma discharge, depositing a second copper wiring in said first and second openings.

10. The method of manufacturing a semiconductor device according to claim 6, including establishing said second plasma discharge in an ambient selected from the group consisting of argon, oxygen, hydrogen, nitrogen, a mixture of hydrogen and nitrogen, a mixture of oxygen and argon, a mixture of nitrogen and argon, and a mixture of hydrogen and argon.

11. A method of manufacturing a semiconductor device comprising:
preparing a first interlayer insulator film including copper wiring and supported by a semiconductor substrate;
forming an insulating film on said copper wiring and said first interlayer insulator film;
forming a second interlayer insulator film on said insulating film;
forming a first opening in said second interlayer insulator film, said first opening reaching said insulating film;
etching said insulating film at the bottom of said first opening in a first plasma discharge within a gas mixture including fluorine and thereby forming a second opening reaching said copper wiring;
after said first plasma discharge is once extinguished, and before exposing said second opening to the atmosphere, treating said copper wiring at the bottom of said second opening with a second plasma discharge, thereby removing contamination, including a polymer containing fluorine, from said copper wiring;
after treating said copper wiring with said second plasma discharge, forming a native oxide film on a surface of said copper wiring that has been exposed by etching of said insulating film;
after forming said native oxide film, forming a barrier metal layer at the bottom of said second opening and on sidewalls of said first and second openings; and
depositing a copper layer in said first and second openings.

12. The method of manufacturing a semiconductor device according to claim 11, wherein said insulating film is a silicon nitride film.

13. The method of manufacturing a semiconductor device according to claim 11, wherein said gas mixture includes at least one of tetrafluoromethane and trifluoromethane.

14. The method of manufacturing a semiconductor device according to claim 11, including establishing said second plasma discharge in an ambient selected from the group consisting of argon, oxygen, hydrogen, nitrogen, a mixture of hydrogen and nitrogen, a mixture of oxygen and argon, a mixture of nitrogen and argon, and a mixture of hydrogen and argon.

15. The method of manufacturing a semiconductor device according to claim 3, including, during treating said copper wiring with said second plasma discharge, applying a bias power between a first electrode supporting said semiconductor substrate between said first and second electrodes, and maintaining surface temperature of said first electrode at no more than 25° C.

16. A method of manufacturing a semiconductor device comprising:
forming a first dielectric layer supported by a semiconductor substrate;
forming a groove in said first dielectric layer;
depositing a first barrier metal layer in the groove;
depositing a first copper layer on said first barrier metal layer in the groove to form wiring;
depositing an insulating film on said first dielectric layer and said wiring;
forming a second dielectric layer on said insulating film;
etching said second dielectric layer to form a via hole reaching said insualting film;
etching said insulating film in said via hole with a gas mixture including fluorine to expose a part of said wiring;

before exposing the part of said wiring that is exposed by etching and said via hole to the atmosphere, plasma treating said wiring in said via hole to remove contamination, including fluorijne, from said wiring after plasma treating, forming a native oxide film on a surface of said wiring that has been exposed by etching of said insulating film;

after forming said native oxide film, depositing a second barrier metal layer in said via hole; and depositing a second copper layer on said second barrier metal layer.

17. A method of manufacturing a semiconductor device comprising:

preparing a first interlayer insulator film including first copper wiring and supported by a semiconductor substrate;

forming an insulating film on said first copper wiring;

forming a second interlayer insulator film on said insulating film;

forming a first opening in said second interlayer insulator film, said first opening reaching said insulating film;

etching said insulating film at the bottom of said first opening in a first plasma discharge within a gas mixture including fluorine and thereby forming a second opening reaching said first copper wiring;

before exposing said second opening to the atmosphere, treating said first copper wiring at the bottom of said second opening with a second plasma discharge to remove contamination, including a polymer containing fluorine, from said first copper wiring;

after treating said first copper wiring with said second plasma discharge, forming a native oxide film on a surface of said first copper wiring that has been exposed by etching of said insulating film;

after forming said native oxide film, forming a barrier metal layer in said second opening; and after forming said barrier metal layer, forming a second copper wiring in said second opening.

18. The method of manufacturing a semiconductor device according to claim 17, wherein said insulating film is a silicon nitride film.

19. The method of manufacturing a semiconductor device according to claim 17, wherein said gas mixture includes at least one of tetrafluoromethane and trifluoromethane.

20. The method of manufacturing a semiconductor device according to claim 17, including establishing said second plasma in an ambient selected from the group consisting of argon, oxygen, hydrogen, nitrogen, a mixture of hydrogen and nitrogen, a kixture of oxygen and argon, a mixture of nitrogen and argon, and a mixture of hydrogen and argon.

21. The method of manufacturing a semiconductor device according to claim 17, including, during treating said first copper wiring with said second plasma discharge, applying a bias power between a first electrode supporting said semiconductor substrate and a second electrode, opposite said first electrode, with said semiconductor substrate between said first and second electrodes, and maintaining surface temperature of said first electrode at no more than 25° C.

* * * * *